(12) United States Patent
Hanyu et al.

(10) Patent No.: US 10,608,016 B2
(45) Date of Patent: *Mar. 31, 2020

(54) SEMICONDUCTOR DEVICE

(71) Applicant: Japan Display Inc., Minato-ku (JP)

(72) Inventors: Yuichiro Hanyu, Minato-ku (JP);
Arichika Ishida, Minato-ku (JP);
Masahiro Watabe, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/286,146

(22) Filed: Feb. 26, 2019

(65) Prior Publication Data

US 2019/0198533 A1 Jun. 27, 2019

Related U.S. Application Data

(63) Continuation of application No. 15/867,847, filed on Jan. 11, 2018, now Pat. No. 10,290,657.

(30) Foreign Application Priority Data

Jan. 30, 2017 (JP) ................................ 2017-014389

(51) Int. Cl.
*H01L 27/12* (2006.01)
*H01L 29/49* (2006.01)
(Continued)

(52) U.S. Cl.
CPC ...... *H01L 27/1237* (2013.01); *H01L 21/0217* (2013.01); *H01L 21/0262* (2013.01);
(Continued)

(58) Field of Classification Search
CPC ............ H01L 27/1229; H01L 27/1233; H01L 27/1237; H01L 27/1248; H01L 27/1251; H01L 2021/775
(Continued)

(56) References Cited

U.S. PATENT DOCUMENTS 10,290,657 B2 * 5/2019 Hanyu ................ H01L 27/1248
2013/0334502 A1 * 12/2013 Liu ..................... H01L 27/3265
257/40

(Continued)

FOREIGN PATENT DOCUMENTS

JP 2015-144265 8/2015

*Primary Examiner* — David Vu
*Assistant Examiner* — Brandon C Fox
(74) *Attorney, Agent, or Firm* — Oblon, McClelland, Maier & Neustadt, L.L.P.

(57) ABSTRACT

A display device has a thin film transistor on a substrate. The thin film transistor includes a first transistor having an oxide semiconductor film, a first gate insulating film, and a first gate electrode and a second transistor having a silicon semiconductor film, a second gate insulating film, and a second gate electrode. The first gate insulating film includes a first insulating film and a second insulating film. The oxide semiconductor film is positioned between the first insulating film and the substrate. The first insulating film is positioned between the silicon semiconductor film and the substrate and between the second insulating film and the substrate. The second gate insulating film includes an insulating film made of the same material in the same layer as the second insulating film. The first gate electrode and the second gate electrode are in the same layer.

12 Claims, 10 Drawing Sheets

(51) Int. Cl.
*H01L 29/786* (2006.01)
*H01L 21/02* (2006.01)
*H01L 27/32* (2006.01)
*G02F 1/1368* (2006.01)
*G02F 1/1333* (2006.01)
*G02F 1/1362* (2006.01)

(52) U.S. Cl.
CPC .. *H01L 21/02164* (2013.01); *H01L 21/02178* (2013.01); *H01L 21/02274* (2013.01); *H01L 21/02532* (2013.01); *H01L 21/02565* (2013.01); *H01L 21/02592* (2013.01); *H01L 21/02631* (2013.01); *H01L 21/02675* (2013.01); *H01L 27/1222* (2013.01); *H01L 27/1225* (2013.01); *H01L 27/1229* (2013.01); *H01L 27/1233* (2013.01); *H01L 27/1248* (2013.01); *H01L 27/1251* (2013.01); *H01L 27/1274* (2013.01); *H01L 29/4908* (2013.01); *H01L 29/78618* (2013.01); *H01L 29/78633* (2013.01); *H01L 29/78675* (2013.01); *G02F 1/1368* (2013.01); *G02F 1/133345* (2013.01); *G02F 1/136209* (2013.01); *G02F 2201/501* (2013.01); *H01L 27/3262* (2013.01); *H01L 29/7869* (2013.01)

(58) Field of Classification Search
USPC .................................................. 257/40, 43
See application file for complete search history.

(56) References Cited

U.S. PATENT DOCUMENTS

| | | |
|---|---|---|
| 2015/0123084 A1 | 5/2015 | Kim |
| 2015/0187952 A1 | 7/2015 | Yamazaki et al. |
| 2016/0372497 A1 | 12/2016 | Lee |
| 2017/0162713 A1 | 6/2017 | Matsumoto |

* cited by examiner

SEMICONDUCTOR DEVICE

CLAIM OF PRIORITY

The present application is a continuation Application of U.S. application Ser. No. 15/867,847, filed Jan. 11, 2018, which claims priority from Japanese patent application JP No. 2017-014389 filed on Jan. 30, 2017, the content of which is hereby incorporated by reference into this application.

BACKGROUND

This disclosure relates to a display device, and particularly it can be applied to a display device provided with a thin film transistor using a silicon semiconductor film and a thin film transistor using an oxide semiconductor film.

Semiconductors of thin film transistor (TFT: Thin Film Transistor) are classified by the purpose of the use: such as amorphous silicon, polycrystalline silicon, and oxide semiconductor (for example, Japanese Unexamined Patent Application Publication No. 2015-144265 and its corresponding US patent application Publication No. 2015-0187952). A thin film transistor using polycrystalline silicon is suitable for a high functional display device formed integrally with a driving circuit because of having high field effect mobility. A thin film transistor using an oxide semiconductor is suitable for a pixel switching element because of having a small leak current, at the non-conductive time.

SUMMARY

A silicon-based semiconductor such as polycrystalline silicon requires hydrogen in order to terminate defect caused by the hydrogen, while an oxide semiconductor requires exclusion of hydrogen because the deoxidization by the hydrogen deteriorates the initial characteristics and reliability. When a thin film transistor of a silicon-based semiconductor and a thin film transistor of an oxide semiconductor are formed within the same substrate, it is necessary to resolve the above conflicting characteristics of the silicon-based semiconductor and the oxide semiconductor.

Other objects and novel characteristics will be apparent from the description of the disclosure and the attached drawings.

The outline of the typical one of the disclosure will be briefly described as follows.

A display device includes a thin film transistor on a substrate. The thin film transistor includes a first transistor having an oxide semiconductor film, a first gate insulating film, and a first gate electrode and a second transistor having a silicon semiconductor film, a second gate insulating film, and a second gate electrode. The first gate insulating film includes a first insulating film and a second insulating film. The oxide semiconductor film is positioned between the first insulating film and the substrate. The first insulating film is positioned between the silicon semiconductor film and the substrate and between the second insulating film and the substrate. The second gate insulating film includes an insulating film made of the same material in the same layer as the second insulating film. The first gate electrode and the second gate electrode are in the same layer.

DESCRIPTION OF THE PREFERRED EMBODIMENTS

A thin film transistor according to one embodiment includes a thin film transistor using an oxide semiconductor film and a thin film transistor using a silicon-based semiconductor film, the oxide semiconductor film is provided between the silicon-based semiconductor film and a substrate, and an insulating film (hydrogen block layer) which does not transmit hydrogen, such as a fluorine-added silicon nitride film (SiNF) and an aluminum oxide film (AlO) is provided between the oxide semiconductor film and the silicon-based semiconductor film. Further, an oxide film capable of supplying oxygen to an oxide semiconductor film such as a silicon oxide film (SiO) is provided between the oxide semiconductor film and the insulating film of blocking hydrogen. The insulating film which does not transmit hydrogen is also the insulating film (oxygen block layer) which does not transmit oxygen. Each of the thin film transistor using the oxide semiconductor film and the thin film transistor using the silicon-based semiconductor film is formed to have a gate electrode, a source electrode, and a drain electrode in the same layer. The expression of AB (for example, SiO) in the specification indicates a compound of each component element A or B and does not mean the compound ratio of the A is equal to that of the B. They have the respective basic compound ratios but the actual compound ratio of each is generally away from each basic compound ratio. The SiNF also means the component elements Si, N, and F but not indicate the compound ratio thereof and the form of their combination.

By providing the hydrogen block layer, it is possible to block the hydrogen entering into the oxide semiconductor film, for example, at hydrogenation of Low Temperature Poly-Silicon (LTPS) in the silicon-based semiconductor film and suppress the deoxidization, hence to improve the reliability in the thin film transistor of the oxide semiconductor film. By providing an oxide film between the oxide semiconductor film and the oxygen block layer in contact with the oxide semiconductor film, oxygen can be supplied to the oxide semiconductor film.

Further, by providing the oxygen block layer it is possible to block the oxygen coming from the oxide semiconductor film, for example, at thermal processing of the silicon-based semiconductor film, hence to improve the reliability in the thin film transistor of the oxide semiconductor.

The gate electrode, the source electrode, and the drain electrode are formed in the same layer at once in each of the thin film transistor using the oxide semiconductor film and the thin film transistor using the silicon-based semiconductor film, hence to suppress an increase in the number of the processes.

The layer of the gate insulating film on the side of the thin film transistor using the oxide semiconductor film is thickened, hence to improve the gate breakdown voltage.

The silicon-based semiconductor film is formed upper than the oxide semiconductor film and by passing through the thermal process for forming the silicon-based semiconductor film (LTPS and the like), the thermal processing of the oxide semiconductor film can be omitted. A first object of the invention is to suppress the mobility of oxygen and hydrogen between the oxide semiconductor and the silicon-based semiconductor; therefore, a structure of providing the oxygen (hydrogen) block layer is proposed. Accordingly, the structure of forming the oxide semiconductor upper than the silicon-based semiconductor is included in the invention.

Hereinafter, the embodiments will be described with reference to the drawings. The disclosure is only one example, and proper modifications within the spirit of the invention that can be easily arrived at by those skilled in the art are naturally to be included in the scope of the invention. For the sake of clear description, the figure may be more schematically shown in the width, thickness, and shape of each unit, compared to the actual form; however, it is only one example, but not to restrict the interpretations of the invention. The same codes are attached to the same elements having been described in the specification and the drawings, and the detailed description is properly omitted.

First Embodiment

Figure 1:
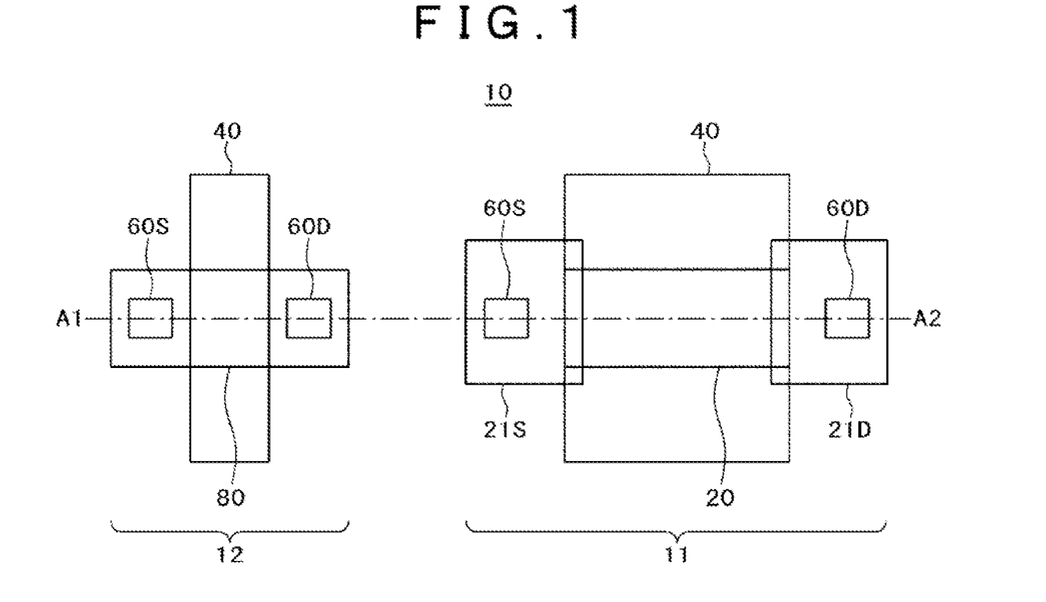
FIG. 1 is a top plan view showing a thin film transistor according to a first embodiment.
Figure 2:
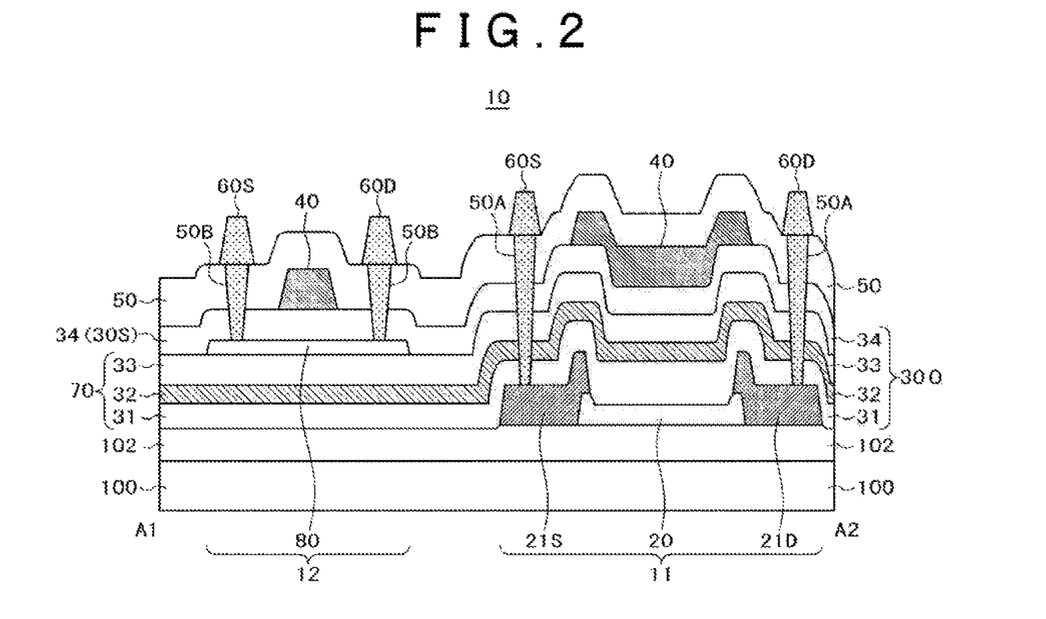
FIG. 2 is a cross-sectional view corresponding to a dashed line A1-A2 in FIG. 1.

A structure of a thin film transistor according to a first embodiment will be described using FIGS. 1 and 2. FIG. 1 is a top plan view showing the thin film transistor according to the first embodiment. FIG. 2 is a cross-sectional view corresponding to the dashed line A1-A2 in FIG. 1. The thin film transistor 10 is used as a switching element and a driving element of a liquid crystal display and an organic EL display device, including a first transistor 11 and a second transistor 12. For convenience sake of description, in FIGS. 1 and 2 the first transistor 11 and the second transistor 12 are arranged adjacently but the arrangement is not restricted to this.

The first transistor 11 is formed in a top gate structure in which, for example, an undercoat film 102, an oxide semiconductor film 20, a metal film 21S forming a source region and a metal film 21D forming a drain region, a gate insulating film 30O, a gate electrode 40, an Interlayer insulating film 50, and a source electrode 60S and a drain electrode 60D are stacked on a substrate 100 in this order. The second transistor 12 is formed in a top gate structure in which, for example, the undercoat film 102, an interlayer insulating film 70, a silicon-based semiconductor film 80, a gate insulating film 30S, the gate electrode 40, the interlayer insulating film 50, and the source electrode 60S and the drain electrode 60D are stacked on the substrate 100 in this order. A display region of a liquid crystal display is exposed to a backlight; therefore, when the first transistor 11 is used in the display region, a light shielding film is preferably formed under the undercoat film 102. Further, when the second transistor 12 is used in the display region, a light shielding film is preferably formed under the undercoat film 102. In this case, the light shielding film of the second transistor 12 may be formed under the undercoat film 102 may be formed on the undercoat film 102 in the same layer as the metal 21S and 21D. The undercoat film 102 may be a part of the first transistor 11, or may not be a part thereof. The undercoat film 102 and the interlayer insulating film 70 may be a part of the second transistor 12 or may not be a part thereof.

The substrate 100 is formed of, for example, a substrate or a plastic substrate.

The oxide semiconductor film 20 is provided on the undercoat film 102 in a shape of island including the gate electrode 40 and its vicinity, working as an active layer of the first transistor 11. The oxide semiconductor film 20 has, for example a thickness of about 50 nm, including a channel region facing the gate electrode 40. The gate insulating film and the gate electrode 40 are formed on the oxide semiconductor film 20 in this order, and a source region in contact with the metal film 21S is provided on one side of the channel region and a drain region in contact with the metal film 21D provided on the other side. The thickness of the metal films 21S and 21D is 10 nm to 100 nm, preferably 30 nm to 70 nm, typically 50 nm.

The oxide semiconductor film 20 is formed of the oxide semiconductor. Here, the oxide semi conductor is the compound including elements such as indium (In), gallium (Ga), zinc (Zn), and tin (Sn) and oxygen. Specifically, as an amorphous oxide semiconductor, indium-gallium-zinc-oxide (In—Ga—Zn—O: IGZO) is exemplified; as a crystal oxide semiconductor, zinc oxide (ZnO), indium-zinc-oxide (In—Zn—O) indium-gallium-oxide (In—Ga—O: IGO), indium-tin-oxide (Indium Tin Oxide: ITO) and indium oxide (InO) are exemplified. The amorphous oxide semiconductor of IGZO is a transparent oxide semiconductor, also referred to as Transparent Amorphous Oxide Semiconductor (TAOS).

The gate insulating film 30O of the first transistor 11 has, for example, a thickness of about 300 nm, including a silicon oxide film (SiO) 31, a hydrogen block layer (oxygen block layer) film 32 such as a fluorine-added silicon nitride film (SiNF) or an aluminum oxide film (AlO), a film stack 33 of SiO and a silicon nitride film (SiN), and a TEOS film (SiO) 34. The TEOS film is a SiO film formed with tetraethoxysilane (TEOS) used as a material gas according to the chemical vapor deposition (CVD).

The interlayer insulating film 70 of the second transistor 12 includes the SiO film 31 that is a part of the layer of the gate insulating film 30O of the first transistor 11, the hydrogen block layer 32 such as the fluorine-added silicon nitride film (SiNF) or the aluminum oxide film (AlO), and the film stack 33 of SiO and SiN.

The silicon-based semiconductor film 80 is provided on the interlayer insulating film 70 in a shape of island including the gate electrode 40 and its vicinity, working as the active layer of the second transistor 12. The silicon-based semiconductor film 80 has, for example, a thickness of about 50 nm, including a channel region facing the gate electrode 40. The gate insulating film 30S (TEOS film 34) and the gate electrode 40 are formed on the silicon-based semiconductor film 80 in this order; a source region is provided on one side of the channel region and a drain region is provided on the other side thereof. The silicon-based semiconductor film 80 is formed of, for example, the amorphous silicon or the polycrystalline silicon. The silicon-based semiconductor film 80 and the oxide semiconductor film 20 are separated from each other by the hydrogen block layer 32.

The gate insulating film 30S of the second transistor 12 is formed by the TEOS film (SiO) 34 that is a part of the gate insulating film 30O of the first transistor 11.

The gate electrodes 40 of the first transistor 11 and the second transistor 12 are formed in the same layer, in selective regions above the substrate 100, for example, with a thickness of 10 nm to 500 nm, specifically, about 200 nm, and formed of molybdenum (Mo). The gate electrode 40 preferably has a low resistance; therefore, as its component material, a metal of low resistance such as aluminum (Al) or copper (Cu) preferable. Further, a film stack in combination of a low resistance layer including aluminum (Al) or copper (Cu) and a barrier layer including titanium (Ti) or molybdenum (Mo) is preferable. This can reduce the resistance of the gate electrode 40.

The interlayer film 50 is provided contact with the TEOS film 34 and the gate electrode 40.

The source electrode 60S and the drain electrode 60D of the first transistor 11 are coupled to the metal film 21S and the metal film 21D through connection holes 50A provided in the gate insulating film 30O and the interlayer insulating film 50. The source electrode 60S and the drain electrode 60D of the second transistor 12 are coupled to the source region and the drain region through connection holes 50B provided in the gate insulating film 30S and the interlayer insulating film 50. The source electrode 60S and the drain electrode 60D of the first transistor 11 and the source electrode 60S and the drain electrode 60D of the second transistor 12 are formed in the same layer, for example, with a thickness of about 200 nm and made of molybdenum (Mo). The source electrode 60S and the drain electrode 60D are preferably formed of a metal wiring of low resistance such as aluminum (Al) or copper (Cu), similarly to the gate electrode 40. Further, a film stack in combination of a low resistance layer including aluminum (Al) or copper (Cu) and a barrier layer including titanium (Ti) or molybdenum (Mo) is preferable. By using this film stack, driving with less wiring delay is enabled.

The source electrode 60S and the drain electrode 60D are preferably provided in a region excluding the region just above the gate electrode 40. This can reduce a parasitic capacity formed in each intersecting region of the gate electrode 40 and the source electrode 60S and the gate electrode 40 and the drain electrode 60D.

A manufacturing method of the thin film transistor 10 will be described using FIGS. 3 to 12. FIGS. 3 to 12 are cross-sectional views showing the manufacturing method of the thin film transistor in FIG. 2, in the order of the processes.

Figure 3:
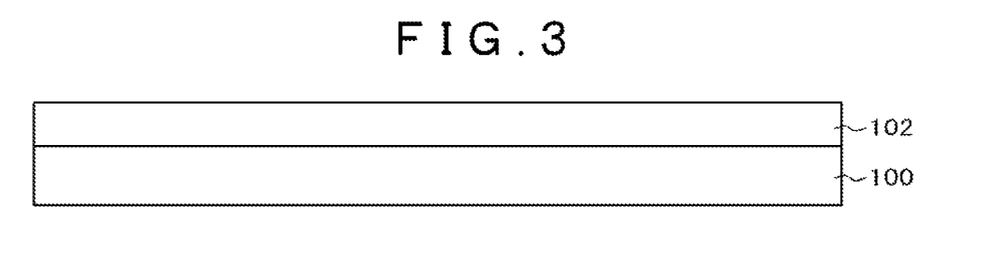
FIG. 3 is a cross-sectional view showing a manufacturing method of the thin film transistor in FIG. 2.

As shown in FIG. 3, the undercoat film 102 is formed by SiO, a stack of silicon nitride (SiN) and SiO, or a stack of aluminum oxide film (AlO) and SiO on the whole surface of the substrate 100.

Figure 4:
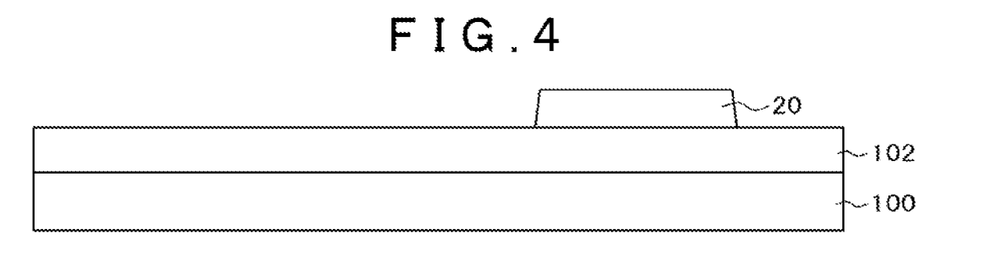
FIG. 4 is a cross-sectional view showing the manufacturing method of the thin film transistor in FIG. 2.

As shown in FIG. 4, the oxide semiconductor film 20 made of the above mentioned material is formed on the whole surface of the undercoat film 102 with a thickness of about 50 nm, for example, according to the sputtering method. Then, the oxide semiconductor film 20 is formed in a shape of island including the channel region, the source region on one side of the channel region, and the drain region on the other side thereof, for example, according to the photolithography and etching. Here, preferably the etching is performed by the wet etching and the thermal processing is performed at a temperature of 300 to 400° C.

Figure 5:
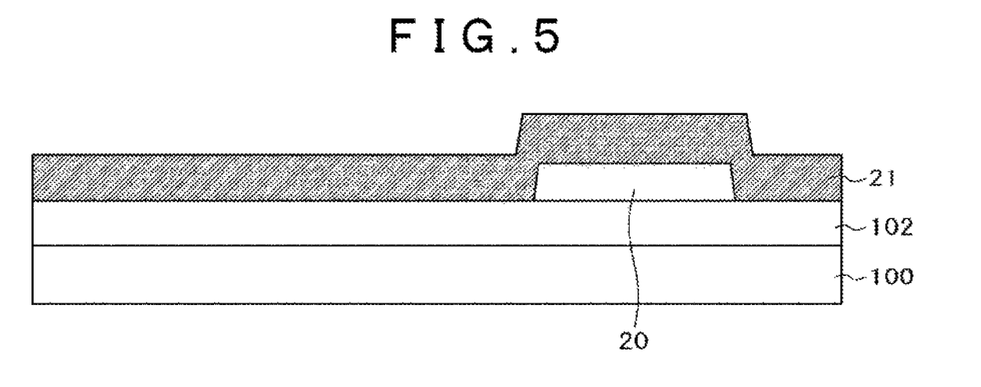
FIG. 5 is a cross-sectional view showing the manufacturing method of the thin film transistor in FIG. 2.

As shown in FIG. 5, the metal film 21 is formed on the undercoat film 102 and on the whole surface of the oxide semiconductor film 20, with a thickness of 10 nm to 100 nm, for example, according to the sputtering method.

Figure 6:
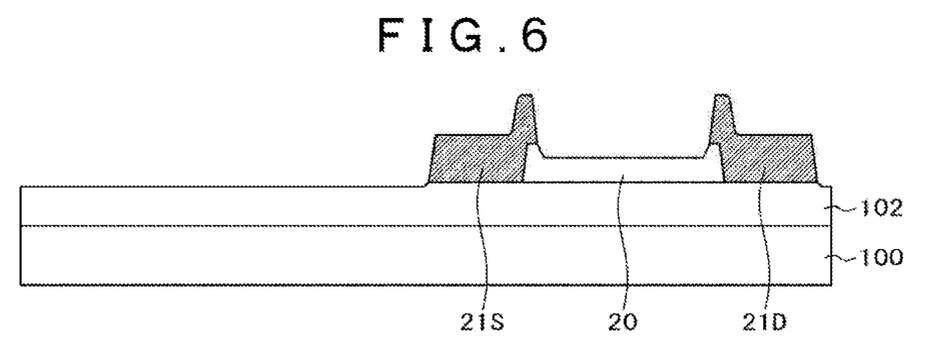
FIG. 6 is a cross-sectional view showing the manufacturing method of the thin film transistor in FIG. 2.

As shown in FIG. 6, the metal film 21 is formed into a desired shape to form the metal film 21S of the source region and the metal film 21D of the drain region, for example, according to the photolithography and etching.

Figure 7:
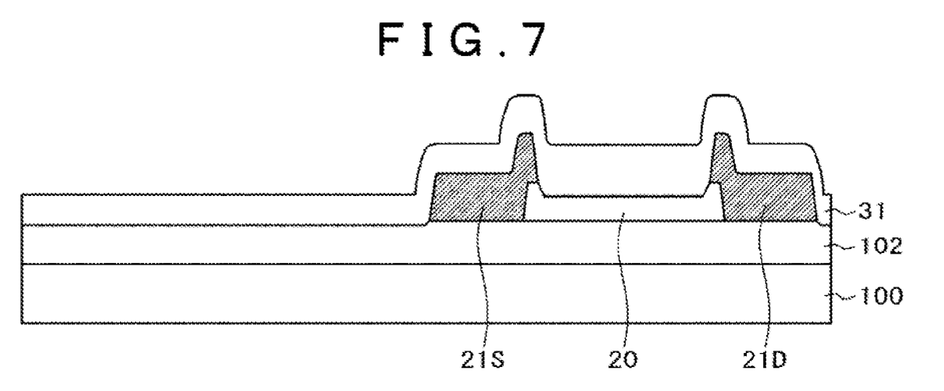
FIG. 7 is a cross-sectional view showing the manufacturing method of the thin film transistor in FIG. 2.

Continuously, as shown in FIG. 7, the SiO 31 is formed on the undercoat film 102, the oxide semiconductor film 20, the metal film 21S, and the metal film 21D with a thickness of about 300 nm, for example, according to the plasma Chemical Vapor Deposition (CVD). The SiO 31 can be formed also according to the reactive sputtering method other than the plasma CVD method.

Figure 8:
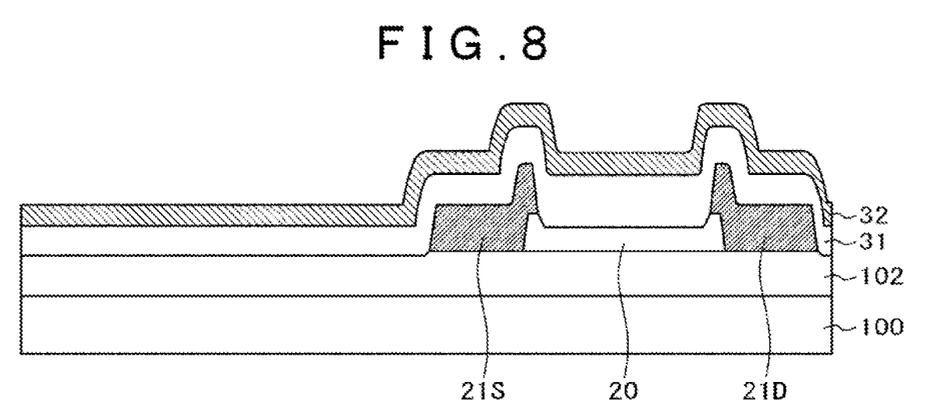

As shown in FIG. 8, the hydrogen block layer (oxygen block layer) 32 such as the fluorine-added silicon nitride film (SiNF) or the aluminum oxide film (AlO) is formed on the whole surface of the SiO film 31 with a thickness of about 10 to 50 nm, for example, according to the plasma CVD method. The aluminum oxide film (AlO) can De formed according to the reactive sputtering method, the CVD method or the atomic layer film formation method.

Figure 9:
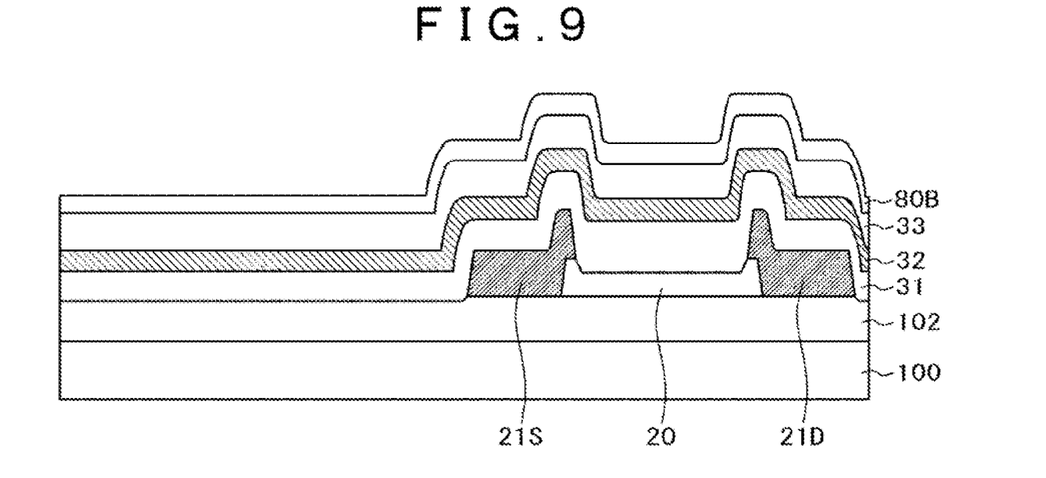
FIG. 9 is a cross-sectional view showing the manufacturing method of the thin film transistor in FIG. 2.

As shown in FIG. 9, the film stack 33 of SiO and SiN is formed with thickness of about 300 nm, for example, according to the plasma CVD method.

The amorphous silicon film is formed on the whole surface of the film stack 32S with a thickness of about 50 nm, for example, according to the plasma CVD method, and passing through the dehydrogenation annealing, the laser annealing is conducted to polycrystallize the amorphous silicon film into a low temperature polysilicon (LTPS) film. The low temperature polysilicon film is formed into a desired shape to form the silicon-based semiconductor film 80, for example, according to the photolithography and etching.

Figure 10:
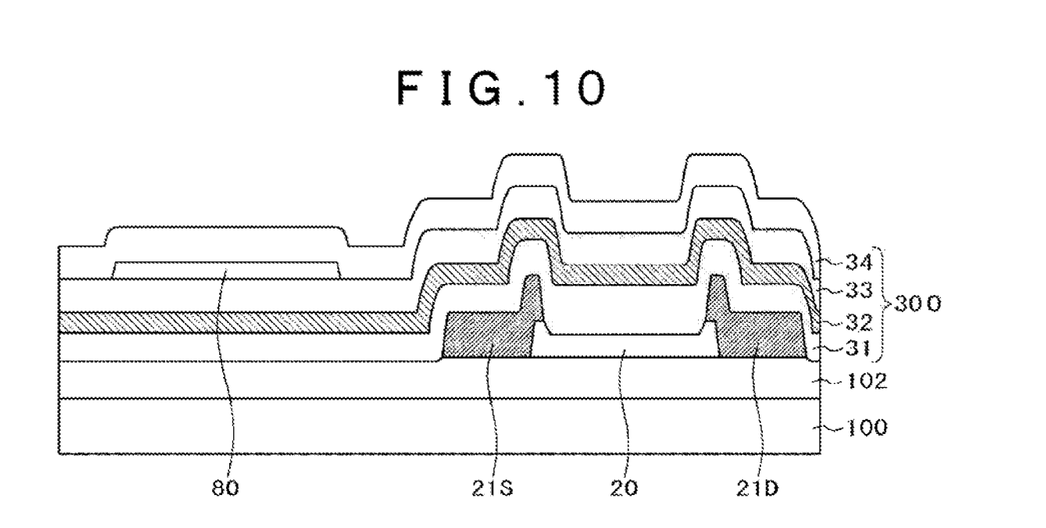
FIG. 10 is a cross-sectional view showing the manufacturing method of the thin film transistor in FIG. 2.

As shown in FIG. 10, the SiO film (TEOS film) 34 is formed on the silicon-based semiconductor film 80 and the film stack 33, for example, according to the plasma CVD method using liquid such as tetraethoxysilane (TetraEthOxySilane: TEOS($Si(OC_2H_5)_4$)).

Figure 11:
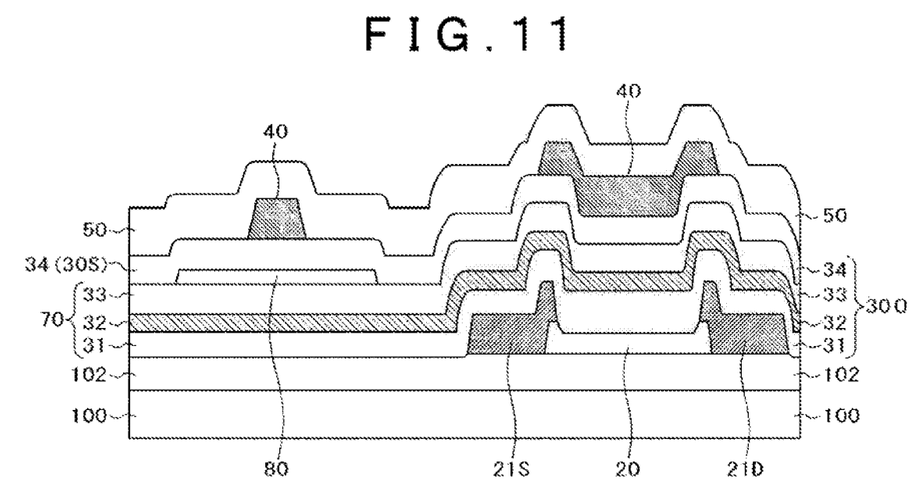
FIG. 11 is a cross-sectional view showing the manufacturing method of the thin film transistor in FIG. 2.

Then, as shown in FIG. 11, the gate electrode material film made of a single layer or a film stack of molybdenum (Mo), titanium (Ti), or/and aluminum (Al) is formed on the TEOS film 34 with a thickness of about 200 nm, for example, according to the sputtering method. After forming the gate electrode material film, the same film is formed into a desired shape, for example, according to the photolithography and etching, to form the gate electrodes 40 on the channel regions of the oxide semiconductor film 20 and the silicon-based semiconductor film 80.

The interlayer insulating film 50 made of a single layer of SiO or a film stack of SiO and SiN is formed on the gate insulating films 30O and 30S and the gate electrode 40 with a thickness of about 300 nm, for example, according to the plasma CVD method. The SiO and SiN film can be formed according to the reactive sputtering method other than the plasma CVD method.

Figure 12:
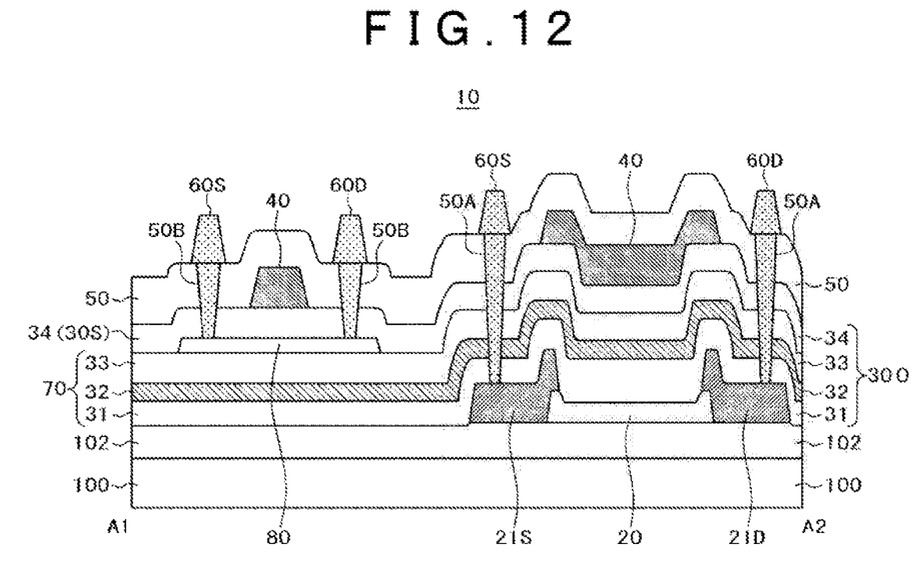
FIG. 12 is a cross-sectional view showing the manufacturing method of the thin film transistor in FIG. 2.

Continuously, as shown in FIG. 12, the connection holes 50A are formed in the interlayer insulating film 50 and the gate insulating film 30O and the connection holes 50B are formed in interlayer insulating film 50 and the gate insulating film 30S, for example, according to the photolithography and etching. Then, for example, the molybdenum (Mo) film is formed on the interlayer insulating film 50 with a thickness of 200 nm, for example, according to the sputtering method and further formed into a predetermined shape according to the photolithography and etching. According to this, as shown in FIG. 2, the source electrode 60S and the drain electrode 60D are respectively coupled to the metal film 21S of the source region and the metal film 21D of the drain region through the connection holes 50A. Further, the source electrode 60S and the drain electrode 60D are respectively coupled to the source region of the silicon-based semiconductor film 80 and the drain region of the silicon-based semiconductor film 80 through the connection holes 50B. According to this, the thin film transistor 10 shown in FIG. 2 is completed.

Second Embodiment

Figure 13:
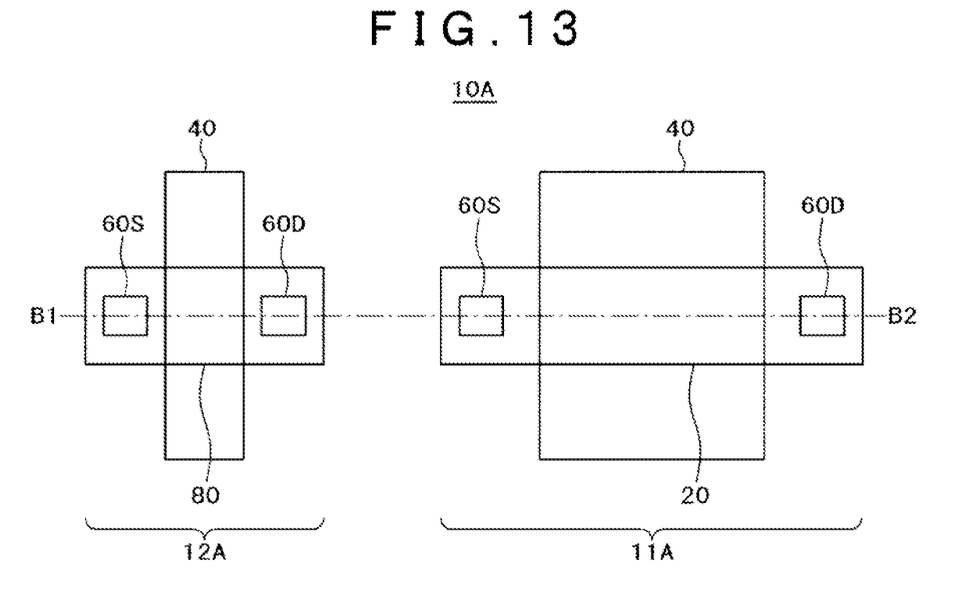
FIG. 13 is a top plan view showing a thin film transistor according to a second embodiment.
Figure 14:
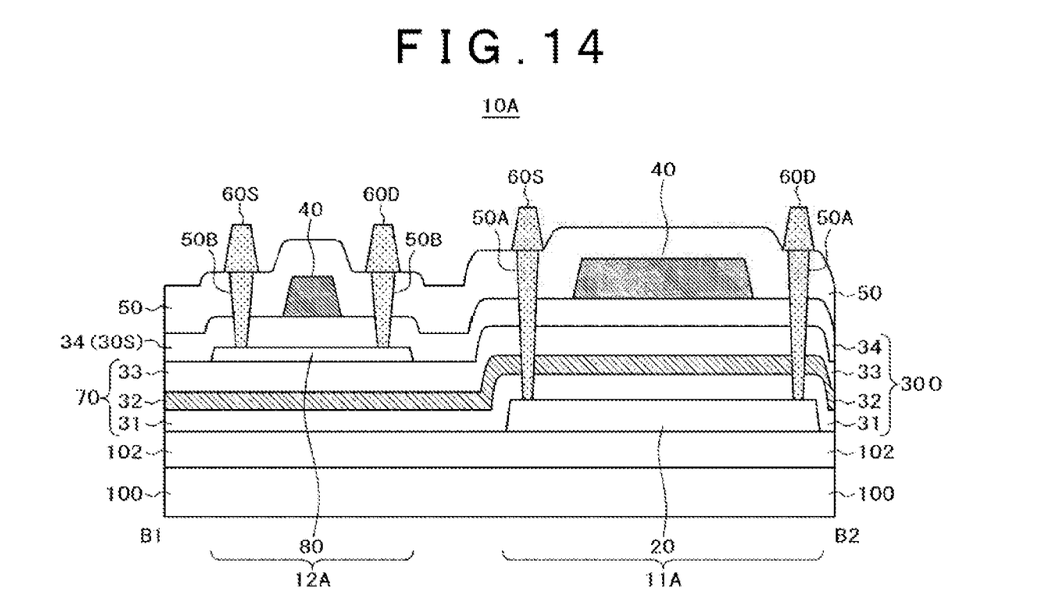
FIG. 14 is a cross-sectional view corresponding to a dashed line B1-B2 in FIG. 13.

A thin film transistor according to a second embodiment is an example of not using the metal film 21S and the metal film 21D in the first embodiment. The structure of the thin film transistor according to the second embodiment will be described using FIGS. 13 and 14. FIG. 13 is a top plan view showing the thin film transistor according to the second embodiment. FIG. 14 is a cross-sectional view corresponding to the dashed line B1-B2 in FIG. 13.

A thin film transistor 10A is to be used as a switching element and a driving element of a liquid crystal display and an organic EL display device, including a first transistor 11A and a second transistor 12A. Although the first transistor 11A and the second transistor 12A are arranged adjacently in FIGS. 13 and 14 for convenience sake in the description, the arrangement is not restricted to this. The thin film transistor 10A is formed in the same structure in the same way as the thin film transistor 10, except for the metal films 21S and 21D.

The first transistor 11A is formed in a top gate structure in which, for example, the undercoat film 102, the oxide semiconductor film 20, the gate insulating film 30O, the gate electrode 40, the interlayer insulating film 50, and the source electrode 60S and the drain electrode 60D are stacked on the substrate 100 in this order. The second transistor 12A is formed in a top gate structure in which, for example, the undercoat film 102, the interlayer insulating film 70, the silicon-based semiconductor film 80, the gate insulating film 30S, the gate electrode 40, the interlayer insulating film 50, and the source electrode 60S and the drain electrode 60D are stacked on the substrate 100 in this order. A display region of a liquid crystal display is exposed to a backlight; therefore, when the first transistor 11A is used in the display region, a light shielding film is preferably formed under the undercoat film 102. Further, when the second transistor 12A is used in the display region, a light shielding film is preferably formed under the undercoat film 102.

The oxide semiconductor film 20 is provided on the undercoat film 102 in a shape of island including the gate electrode 40 and its vicinity, working as the active layer of the first transistor 11A. The oxide semiconductor film 20 has, for example, a thickness of about 50 nm, including a channel region facing the gate electrode 40. The gate insulating film 30 and the gate electrode 40 are formed on the oxide semiconductor film 20 in this order; a source region in contact with the source electrode 60S is provided on one side of the channel region, and a drain region in contact with the drain electrode 60D is provided on the other side thereof. The oxide semiconductor film 20 is formed of the same material as the oxide semiconductor film 20 in the first embodiment.

The gate insulating films 30O and 30S of the first transistor 11A are formed of the same material in the same structure as the gate insulating films 30O and 30S of the first transistor 11 in the first embodiment.

The interlayer insulating film 70 of the second transistor 12A is formed of the same material in the same structure as the interlayer insulating film 70 of the second transistor 12 in the first embodiment.

The silicon-based semiconductor film 80, the gate insulating film 30S, and the gate electrode 40 of the second transistor 12A are formed the same way as the second transistor 12 in the first embodiment.

The interlayer insulating film 50 is provided in contact with the TEOS film 34 and the gate electrode 40.

The source electrode 60S mad the drain electrode 60D of the first transistor 11A are respectively coupled to the source region and the drain region of the oxide semiconductor film 20 through the connection holes 50A provided in the gate insulating film 30O and the interlayer insulating film 50. The source electrode 60S and the drain electrode 60D of the second transistor 12A are respectively coupled to the source region and the drain region through the connection holes 50B provided in the gate insulating film 30S and the interlayer insulating film 50, similarly to the second transistor 12 in the first embodiment.

A manufacturing method of the thin film transistor 10A will be hereinafter described.

Similarly to the first embodiment, at first, the undercoat film 102 is formed on the substrate 100. The oxide semiconductor film 20 is formed on the undercoat film 102 in an island shape, similarly to the first embodiment. Continuously, the gate SiO is formed on the undercoat film 102 and the oxide semiconductor film 20, similarly to the first embodiment. The following processes are the same as those of the first embodiment. According to this, the thin film transistor 10A shown in FIG. 14 is completed.

Figure 15:
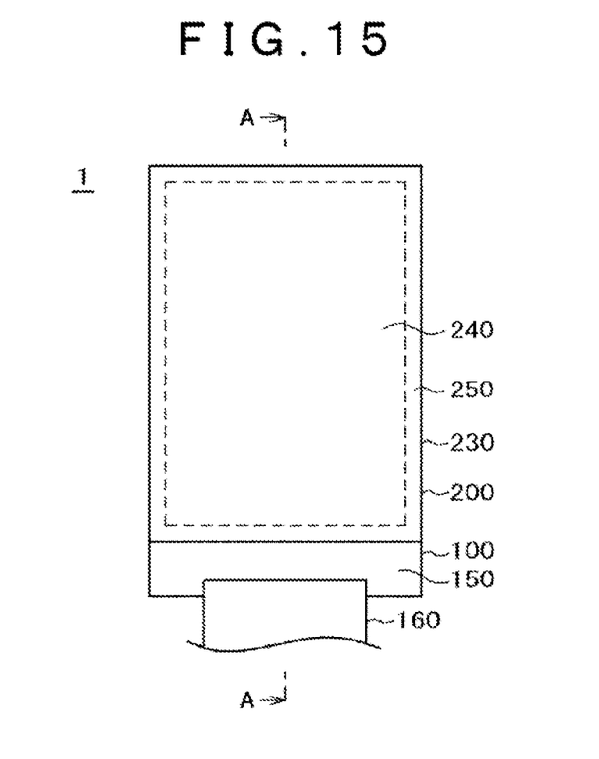
FIG. 15 is a top plan view of a liquid crystal display.
Figure 16:
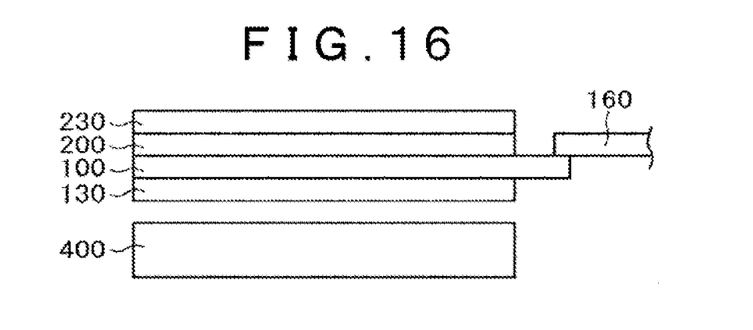
FIG. 16 is a cross-sectional view taken along the line A-A in FIG. 15.
Figure 17:
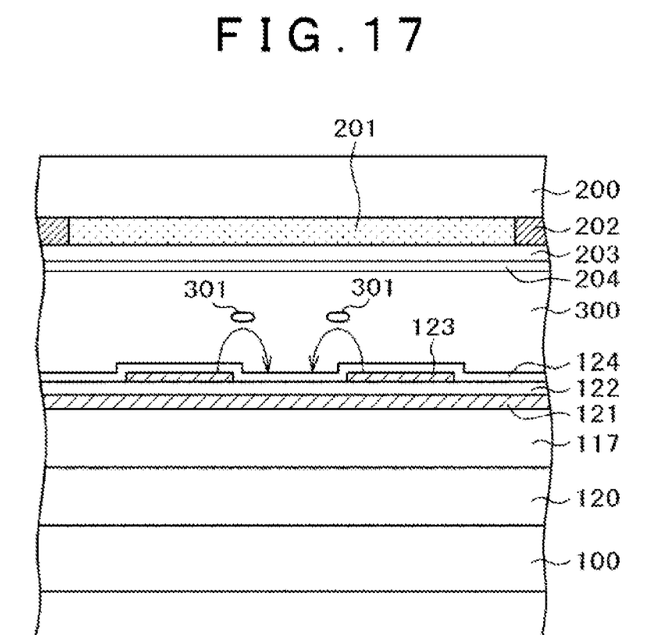
FIG. 17 is a cross-sectional view of a display region of a liquid crystal display in FIG. 15.

A display device having the thin film transistors 10 and 10A as the switching element will be described. FIG. 15 is a top plan view of a liquid crystal display with the thin film transistor according to the first embodiment or second embodiment applied there. FIG. 16 is a cross-sectional view taken along the A-A in FIG. 15. FIG. 17 is a cross-sectional view of the display region of the crystal display. In the liquid crystal display 1, the substrate 100 and the opposite substrate 200 are formed oppositely and a liquid crystal layer 300 (refer to FIG. 17) is sandwiched between the substrate 100 and the opposite substrate 200. A lower polarizing plate 130 is attached to the lower side of the substrate 100 and an upper polarizing plate 230 is attached to the upper side of the opposite substrate 200.

The substrate 100 is formed larger than the opposite substrate 200, portion of the substrate 100 having nothing but a single sheet of the substrate itself is a terminal unit 150, where a flexible wiring substrate 160 is coupled to supply signals and power to the liquid crystal display 1 from the outside. The liquid crystal display panel does not emit light by itself and a backlight 400 is arranged on the rear surface of the liquid crystal display 1.

The liquid crystal display 1 is formed by the display region 240 and the peripheral region 250, as shown in FIG. 15. In the display region 240, a lot of pixels are formed in a matrix shape and each pixel has a thin film transistor as the switching element. In the peripheral region, a driving circuit for driving the scanning lines and the video signal lines is formed.

Rationally considered, the thin film transistor used for a pixel should be formed the oxide semiconductor because of requiring a small leak current, while the thin film transistor used for the peripheral driving circuit should be formed of the LTPS because of requiring large mobility.

In FIG. 17, the TFT array layer 120 is formed on the substrate 100. The TFT array layer 120 has a layer structure of the thin film transistors 10 and 10A shown in FIGS. 2 and 14. In FIG. 16, an organic passivation film 117 is formed on the above layer 120.

FIG. 17 is in the case of the IPS-type liquid crystal display, and a common electrode 121 is formed on the organic passivation film 117 in a plane shape. A capacity insulating film 122 is formed to cover the common electrode 121, and the pixel electrode 123 is formed thereon. The pixel electrode 123 is formed in a comb shape or stripe shape. An alignment film 124 for initially orientating liquid crystal molecules 301 is formed to cover the pixel electrode 123.

When a video signal is applied between the pixel electrode 123 and the common electrode 121, an electric line of force as indicated by arrow is generated, to rotate the liquid crystal molecule 301 and to control the transmittance of the liquid crystal layer 300, hence to form an image.

In FIG. 17, the opposite substrate 200 is arranged so that the liquid crystal layer 300 may be caught between the substrates. A color filter 201 and a black matrix 202 are formed in the opposite substrate 200. The overcoat film 203 is formed to cover the color filter 201 and the black matrix 202, and an alignment film 204 for initially orientating the liquid crystal molecules 301 is formed thereon.

In the liquid crystal display 1, when a video signal is written in the pixel electrode 123, a voltage is held during one frame by a holding capacity formed by the pixel electrode 123, the common electrode 121, and the capacity insulating film 122. Here, when the leak current of the thin film transistor is large, the voltage of the pixel electrode 123 varies and flicker occurs, which damages a good image. By using the thin film transistors 10 and 10A formed of the oxide semiconductor film, it is possible to realize a liquid crystal display having a small leak current and a good image.

Figure 18:
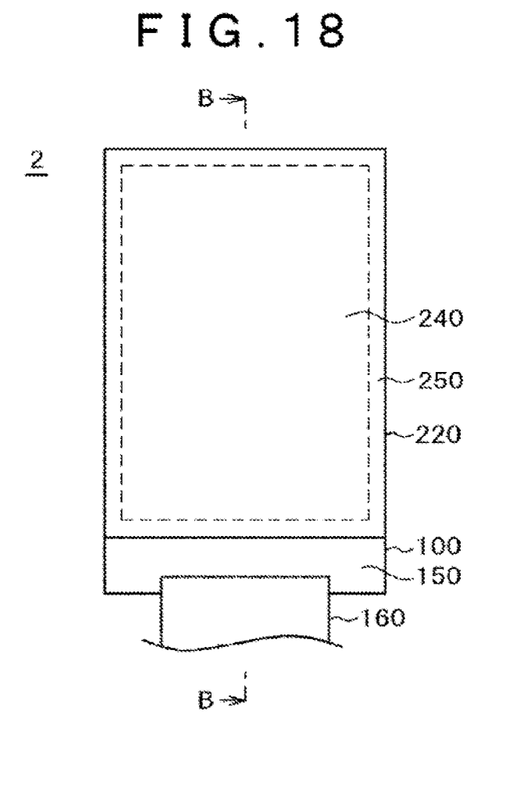
FIG. 18 is a top plan view of an organic EL display device.
Figure 19:
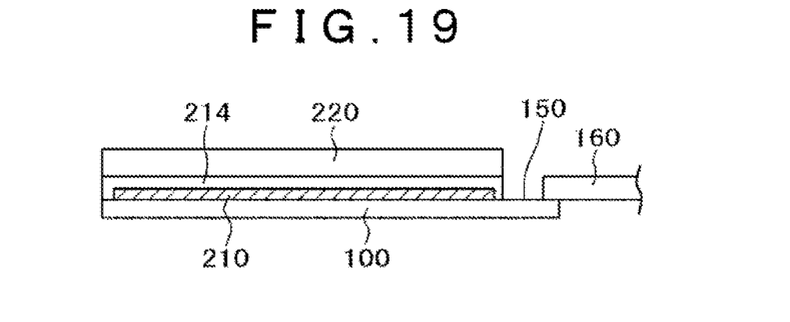
FIG. 19 is a cross-sectional view taken along the line B-B in FIG. 18.
Figure 20:
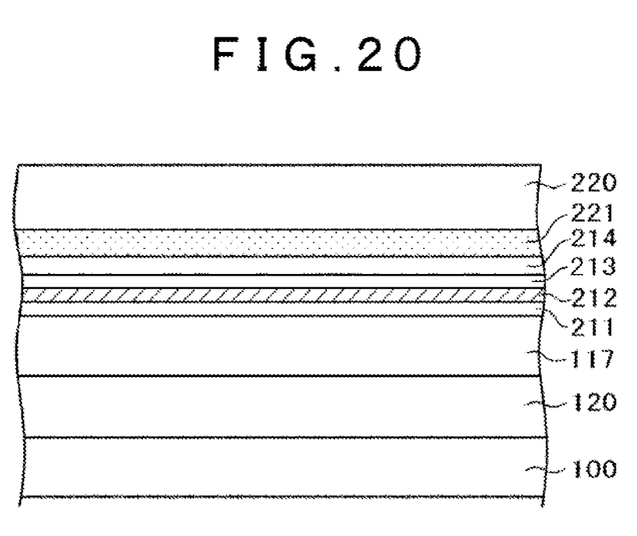
FIG. 20 is cross-sectional view of a display region of an organic EL display device in FIG. 18.

The thin film transistor having been described in the first and the second embodiments can be applied to an organic EL display device. FIG. 18 is a top plan view of the organic EL display device 2. FIG. 19 is a cross-sectional view taken along the line B-B in FIG. 18. FIG. 20 is a cross-sectional view of a display region of the organic EL display device.

In FIG. 18, the display region 240 and the peripheral region 250 are formed. An organic EL driving thin film transistor and a switching thin film transistor are formed in the display region 240. The thin film transistors 10 and 10A formed of the oxide semiconductor film having a small leak current are suitable for the switching thin film transistor. The peripheral driving circuit is formed of the thin film transistor and mainly the LTPS thin film transistor is used.

In FIG. 18, an antireflective polarizing plate 220 is attached to cover the display region 240. The reflection electrode is formed in the organic EL device and the polarizing plate 220 is used to suppress the external light reflection. A terminal 150 is provided in a portion other than the display region 240, and a flexible wiring substrate 160 for supplying the power or signals to the organic EL display device is coupled to the terminal unit 150.

In FIG. 19, a display element layer 210 including organic EL layer is formed on the substrate 100. The display element layer 210 is formed correspondingly to the display region 240 in FIG. 18. Since the organic EL material is resolved by the water, a protective film 214 is formed of SiN to cover the display element layer 210 in order to prevent intrusion of the water from the outside. The polarizing plate 220 is attached to the protective film 214. Further, the terminal unit 150 is formed in the portion other than the display element layer 210 and the flexible wiring substrate 160 is coupled to terminal unit 150.

In FIG. 20, the TFT array layer 120 is formed on the substrate 100. It has a layer structure of the thin film transistors 10 and 10A shown in FIGS. 2 and 14. In FIG. 20, the organic passivation film 117 is formed on the TFT array layer 120.

In FIG. 20, a lower electrode 211 as a cathode is formed on the organic passivation film 117. The lower electrode is formed by a film stack of Al alloy as a reflection electrode and Indium Tin Oxide (ITO) as the cathode. The organic EL layer 212 is formed on the lower electrode 211. The organic EL layer 212 includes, for example, an electron injection layer, an electron transport layer, a light emitting layer, a hole transport layer, and a hole injection layer. An upper electrode 213 as an anode is formed on the organic EL layer 212. The upper electrode 213 is formed of Indium Zinc Oxide (IZO) that is a transparent conductive film and ITO, and sometimes formed of a metallic thin film such as silver. The protective film 214 is formed of SiN to cover the upper electrode 213, and the polarizing plate 220 for preventing the reflection is adhered to the protective film 214 by an adhesive material 221.

Although various types of thin film transistors such as the driving thin film transistor, the switching thin film transistor, and the like are formed on the TFT array layer, the LTPS thin film transistor and the oxide semiconductor thin film transistor can be formed in the common process by using the thin film transistors 10 and 10A, and various combinations of the LTPS thin film transistors and the oxide semiconductor thin film transistors can be used; therefore, it is possible to realize an organic EL display device having an excellent image quality and a small power consumption.

What is claimed is:

1. A semiconductor device, comprising:
   a substrate,
   a first transistor including an oxide semiconductor film, a first gate insulating film, and a first gate electrode on the substrate, and
   a second transistor including a silicon semiconductor film, a second gate insulating film, and a second gate electrode on the substrate,
   wherein the first gate insulating film includes a first insulating film, and a second insulating film,
   wherein the oxide semiconductor film is positioned between the first insulating film and the substrate,
   wherein the first insulating film is positioned between the silicon semiconductor film and the substrate and between the second insulating film and the substrate, wherein the second gate insulating film includes an insulating film made of a same material in a same layer as the second insulating film, and wherein the first gate electrode and the second gate electrode are in the same layer.

2. The semiconductor device according to claim 1, wherein the first insulating film is an insulating film for suppressing transmission of hydrogen.

3. The semiconductor device according to claim 1, wherein the first gate insulating film further includes a third insulating film positioned between the first insulating film and the oxide semiconductor film, and wherein the first insulating film is an insulating film for suppressing transmission of oxygen.

4. The semiconductor device according to claim 3, wherein the first gate insulating film further includes a fourth insulating film positioned between the silicon semiconductor film and the first insulating film.

5. The semiconductor device according to claim 4, wherein the second insulating film and the third insulating film are silicon oxide films, and wherein the fourth insulating film is a film stack of a silicon oxide film and nitride silicon.

6. The semiconductor device according to claim 1, wherein the first insulating film is a fluorine-added silicon nitride film or an aluminum oxide film.

7. The semiconductor device according to claim 1, wherein the oxide semiconductor film is optically transparent and amorphous, and wherein the silicon semiconductor film includes a crystalline structure.

8. The semiconductor device according to claim 1, further comprising:

a first interlayer insulating film in contact with the first gate electrode and the second gate electrode;

a source electrode and a drain electrode of the first transistor formed on an upper layer of the first interlayer insulating film; and a source electrode and a drain electrode of the second transistor in a same layer as the source electrode and the drain electrode of the first transistor.

9. The semiconductor device according to claim 8, further comprising:

a first metal film provided between a source region of the oxide semiconductor film and the source electrode of the first transistor; and a second metal film provided between a drain region of the oxide semiconductor film and the drain electrode of the first transistor.

10. The semiconductor device according to claim 1, further comprising:

an undercoat film positioned between the silicon semiconductor film and the substrate and between the oxide semiconductor film and the substrate, wherein the first gate insulating film is positioned between the silicon semiconductor film and the substrate.

11. The semiconductor device according to claim 10, further comprising:

a light shielding film positioned between the silicon semiconductor film and the substrate and between the oxide semiconductor film and the substrate.

12. The semiconductor device according to claim 1, wherein the substrate is formed of plastic material.

* * * * *